(12) United States Patent
Abe et al.

(10) Patent No.: US 10,431,485 B2
(45) Date of Patent: Oct. 1, 2019

(54) ARTICLE TRANSPORT FACILITY

(71) Applicant: Daifuku Co., Ltd., Osaka-shi (JP)

(72) Inventors: Takeshi Abe, Hinocho (JP); Yasushi Morikawa, Hinocho (JP); Toshihito Ueda, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 134 days.

(21) Appl. No.: 15/789,013

(22) Filed: Oct. 20, 2017

(65) Prior Publication Data
US 2018/0111757 A1    Apr. 26, 2018

(30) Foreign Application Priority Data
Oct. 21, 2016 (JP) ................................ 2016-207262

(51) Int. Cl.
*H01L 21/677* (2006.01)
*B65G 1/04* (2006.01)
*H01L 21/67* (2006.01)

(52) U.S. Cl.
CPC ...... *H01L 21/67769* (2013.01); *B65G 1/0421* (2013.01); *H01L 21/67259* (2013.01); *H01L 21/67733* (2013.01); *H01L 21/67736* (2013.01); *H01L 21/67775* (2013.01); *B65G 2201/0297* (2013.01)

(58) Field of Classification Search
CPC .......... B65G 1/0421; B65G 2201/0279; H01L 21/6773; H01L 21/67769; Y10S 414/14
See application file for complete search history.

(56) References Cited

U.S. PATENT DOCUMENTS

| 7,408,314 B2 * | 8/2008 | Hayashi | B60L 3/0038 |
| | | | 187/222 |
| 8,189,867 B2 * | 5/2012 | Yoshioka | G06K 9/6253 |
| | | | 348/143 |
| 8,928,481 B2 * | 1/2015 | Abe | B65G 1/0435 |
| | | | 235/383 |
| 9,669,996 B2 * | 6/2017 | Morikawa | B65G 1/0421 |
| 9,682,821 B2 * | 6/2017 | Sakamoto | H01L 21/67259 |

FOREIGN PATENT DOCUMENTS

JP        5800193 B2    10/2015

* cited by examiner

*Primary Examiner* — James Keenan
(74) *Attorney, Agent, or Firm* — The Webb Law Firm

(57) ABSTRACT

Before a moving member that moves along a moving path stops, an article transport facility starts protrusion control by which a moving support portion that is provided on the moving member is moved so as to protrude toward a fixed support portion, and thereafter the article transport facility appropriately determines whether or not to continue the protrusion control. Upon the moving member reaching a protrusion start position, the protrusion control is started so that the moving support portion is moved to protrude, even if the moving member has not stopped. After the moving member has reached a position at which a detection unit that is fixed to the moving member can detect a detection target member that is provided on the fixed support portion, the execution of the protrusion control is continued as long as the detection unit is detecting the detection target member.

10 Claims, 9 Drawing Sheets

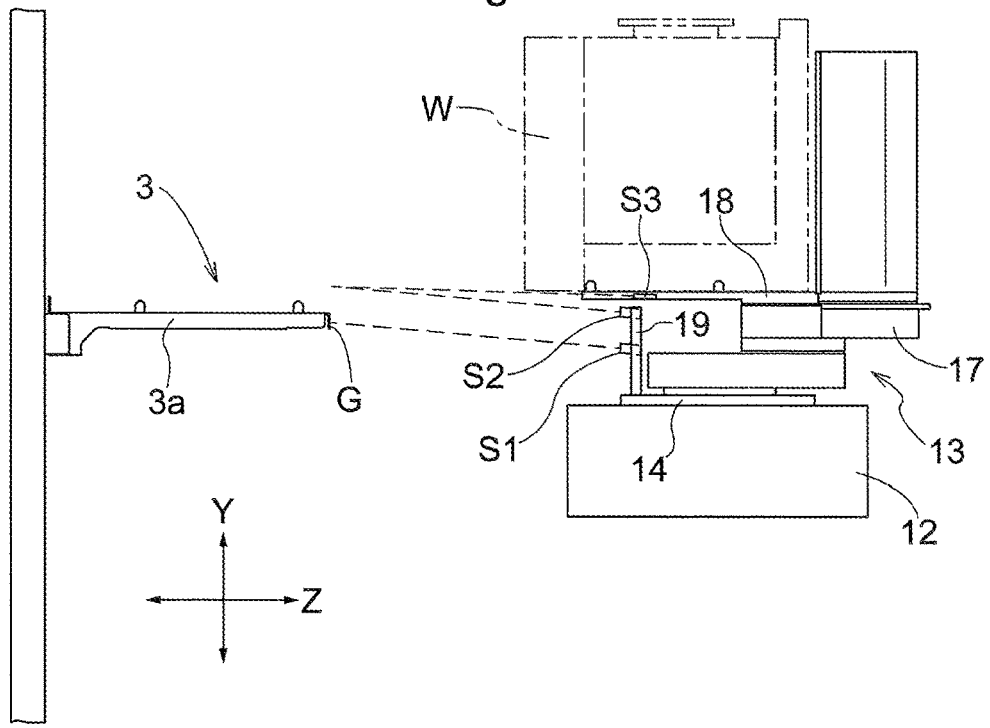
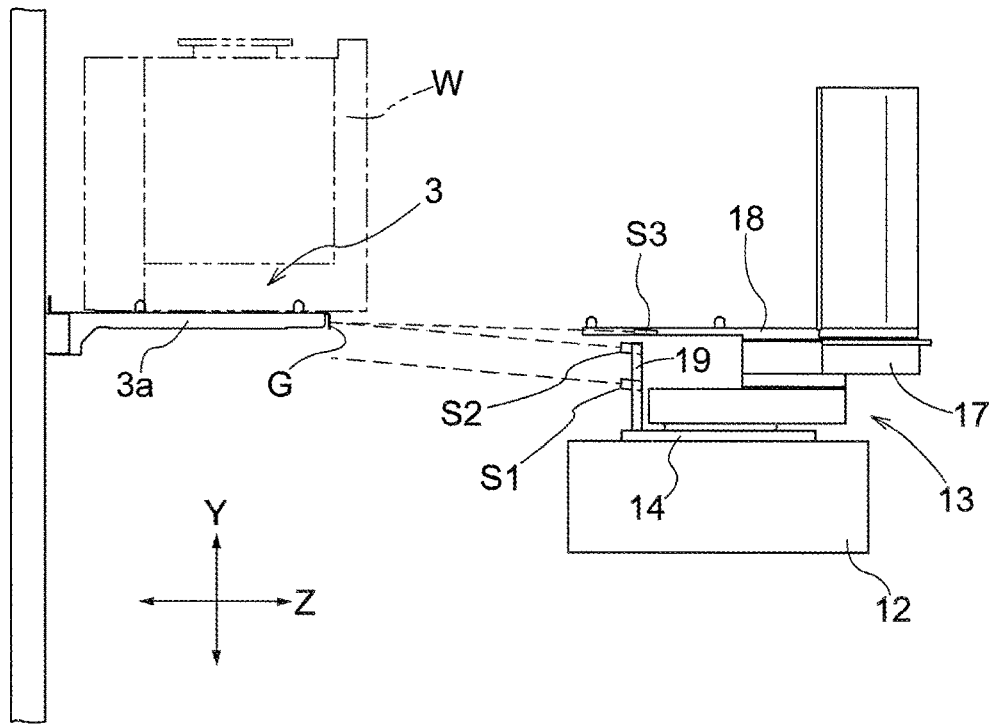

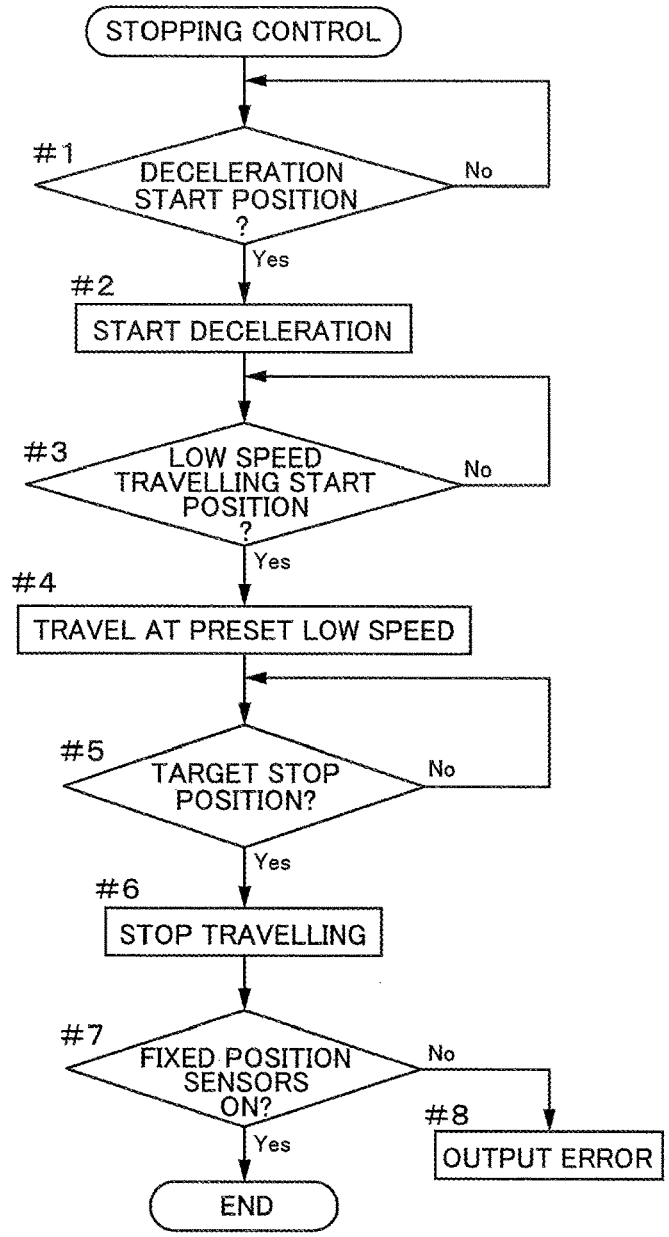
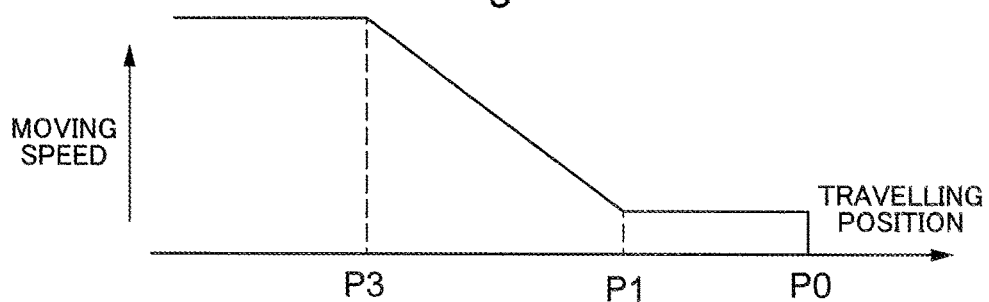

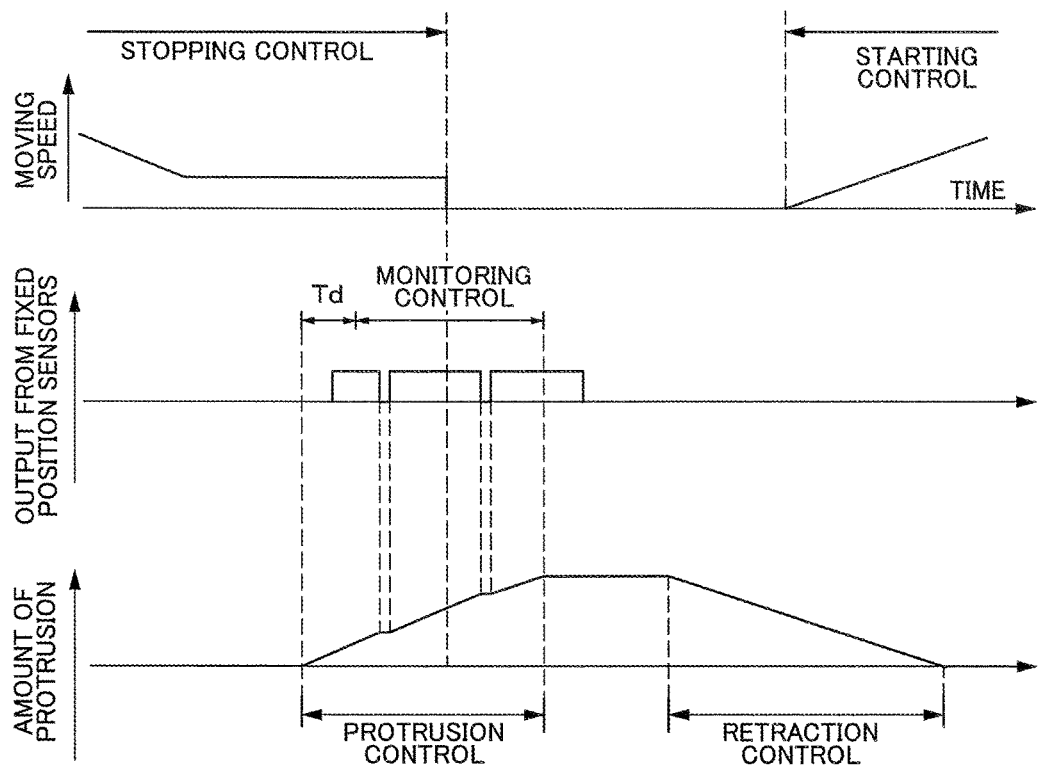

ARTICLE TRANSPORT FACILITY

CROSS-REFERENCE TO RELATED APPLICATION

This application claims priority to Japanese Patent Application No. 2016-207262 filed Oct. 21, 2016, the disclosure of which is hereby incorporated in its entirety by reference.

BACKGROUND OF THE INVENTION

Field of the Invention

The present invention relates to an article transport facility including: a transfer apparatus that receives and supplies an article; and a control unit that controls the transfer apparatus.

Description of the Related Art

JP 5800193B2 discloses an example of an article transport facility including: a transfer apparatus that receives and supplies an article from and to a fixed support portion that supports an article in a fixed state, while a moving support portion moves to protrude and retract; and a control unit that controls the transfer apparatus. This article transport facility is configured such that the control unit executes protrusion control upon a moving member reaching a protrusion start position as a result of stopping control. The protrusion start position is set upstream of a stop position in a direction in which the moving member moves. This technology contributes to improvements in transport efficiency because the execution of protrusion control is started before stopping control has been completed so that the transfer apparatus can complete the reception and supply of an article from and to the fixed support portion as early as possible.

In the case where protrusion control is started before stopping control has been completed as in this article transport facility, if there is a fixed support portion that is adjacent to a fixed support portion that is to receive or supply an article, in the direction in which the moving member moves, an interference-target object such as the adjacent fixed support portion or an article supported by the fixed support portion, and the moving support portion, interfere with each other. Such interference is a problem. Therefore, in this article transport facility, when the amount of movement of the moving support portion from the retracted position in the widthwise direction exceeds a predetermined amount after protrusion control has started, it is determined whether or not the moving member on the moving path has moved past an interference range in which the moving support portion and the interference object interfere with each other, and thereafter the protrusion control is continued.

In this article transport facility, whether or not the moving member has moved past the range in which the moving support portion interferes with the interference object is determined based on positional information regarding the moving member. In this article transport facility, whether or not the moving member has moved past the interference range is determined based on positional information regarding the moving member, and whether or not to continue the protrusion control is not determined by directly detecting the interference object or a structure around the interference object. Paragraph [0090] of JP 5800193B2 discloses that the moving support portion is provided with a presence sensor that detects the presence or absence of an interference object, and whether or not the moving member has moved past the range in which the moving member interferes with the interference object is determined based on detection information from the presence sensor. However, with the moving support portion in the state of being provided with the presence sensor, if an abnormality occurs in the moving support portion regarding the attachment state thereof, whether or not the moving member has moved past the range in which the moving support portion interferes with the interference object may be erroneously determined, and there is also the risk of the moving support portion interfering with the interference object.

SUMMARY OF THE INVENTION

In view of the situation above, there is demand for an article transport facility that can appropriately determine whether or not to continue protrusion control in the case where the protrusion control is started before stopping control has been completed.

An article transport facility in view of the above-described situation, which is one aspect, is an article transport facility including:

a fixed support portion that is provided in a fixed state and supports an article;

a moving member that moves along a moving path that extends via a stop position that is set for the fixed support portion;

a transfer apparatus that is provided with a moving support portion configured to move integrally with the moving member along a widthwise direction that is orthogonal to a lengthwise direction of the moving path within a horizontal plane, and receives and supplies an article from and to the fixed support portion while the moving support portion moves to protrude and retract, between a retracted position at which the moving support portion is housed within the moving path in terms of the widthwise direction and a protruding position at which the moving support portion protrudes outward from the moving path in the widthwise direction; and a control unit that controls movement of the moving member and a transfer operation that is performed by the transfer apparatus, the control unit executing stopping control to stop the moving member at the stop position, and protrusion control to move the moving support portion of the transfer apparatus from the retracted position to the protruding position, wherein the article transport facility further includes:

a detection target member that is provided at a position corresponding to the stop position, and has a length that is equal to a length of an acceptable stop range that is an acceptable range of the stop position, in the lengthwise direction; and a detection unit that is provided on the moving member, at a fixed position relative to the retracted position, and detects the detection target member with the moving member being located within the acceptable stop range, and the control unit starts execution of the protrusion control upon the moving member reaching a protrusion start position as a result of the stopping control, the protrusion start position being set upstream of the stop position in a direction in which the moving member moves, and after the moving member has reached a protrusion monitoring start position that is set downstream of the protrusion start position in the direction in which the moving member moves toward the stop position, the control unit continues the execution of the protrusion control as long as the detection unit is detecting the detection target member.

With this configuration, the protrusion control is started upon the moving member reaching the protrusion start position, before the moving member reaches the stop position as a result of the stopping control executed by the control unit. Therefore, it is possible to start the protrusion control earlier to reduce the time required to perform a receiving operation and a supplying operation after the moving member has stopped at the stop position, and thus it is possible to improve the efficiency of article transportation. The detection target member is located at a position corresponding to the stop position, and has a length that is equal to the length of an acceptable stop range that is an acceptable range of the stop position, in the lengthwise direction. The detection unit detects the detection target member with the moving member being located within the acceptable stop range, which is the acceptable range of the stop position. Therefore, if the detection unit detects the detection target member, the control unit can determine that the moving member is located within the acceptable stop range. Therefore, the control unit can determine whether or not to continue the execution of the protrusion control that has already been started, by monitoring whether or not the detection unit is detecting the detection target portion, after the moving member has reached the protrusion monitoring start position. In addition, the detection unit is provided on the moving member, at a fixed position relative to the retracted position. Therefore, the position of the detection unit does not change even if the moving support portion moves between the retracted position and the protruding position in the widthwise direction, and the detection function of the detection unit is unlikely to be affected even if the attachment state of the moving support portion changes upon impact or over time. Therefore, it is possible to appropriately determine whether or not the moving member is located within the acceptable stop range, to appropriately determine whether or not to continue the protrusion control. In this way, with this configuration, it is possible to obtain an article transport facility that can appropriately determine whether or not to continue the protrusion control after starting the protrusion control, before the stopping control has been completed.

Further features and advantages of the article transport facility will be apparent from the following descriptions of the embodiments with reference to the drawings.

BRIEF DESCRIPTION OF THE DRAWINGS

FIG. 4 is a side view showing that the transfer apparatus is located at a target stop position at which the transfer apparatus performs a supplying operation.

FIG. 5 is a side view showing that the transfer apparatus is located at a target stop position at which the transfer apparatus performs a reception operation.

FIG. 7 is a flowchart showing stopping control in travelling control that is included in empty movement control and actual movement control.

FIG. 8 shows a portion of a pattern in which a moving speed of a stacker crane changes due to travelling control.

FIG. 12 is a timing chart illustrating the execution timing of stopping control, protrusion control, and monitoring control.

DETAILED DESCRIPTION OF PREFERRED EMBODIMENTS

The following describes embodiments of an article transport facility with reference to the drawings. An article transport facility according to the present embodiment includes a stacker crane 1 that transports a container W that can store a plurality of semiconductor substrates, as a moving member. The stacker crane 1 is provided so as to be movable along a straight moving path L that is set inside a warehouse 2. The container W is an example of an article, and is called "FOUP (Front Opening Unified Pod)". Instead of a containers W, palettes that can support various kinds of loads and are formed so as to have a constant size may be employed as articles, and it is preferable that the size of articles is constant. The following describes the details of the configurations of the stacker crane 1 and the warehouse 2 in the article transport facility according to the present embodiment, and the details of the configuration of a control apparatus H that controls the stacker crane 1 so as to transport a container W. In the following description, as indicated by arrows in FIGS. 1 to 3, the lengthwise direction of the moving path L is referred to as a left-right direction X, and a direction that extends in the vertical direction is referred to as a top-bottom direction Y, and a widthwise direction that is orthogonal to the lengthwise direction of the moving path L (the left-right direction X) within a horizontal plane is referred to as a protruding/retracting direction Z.

Figure 1:
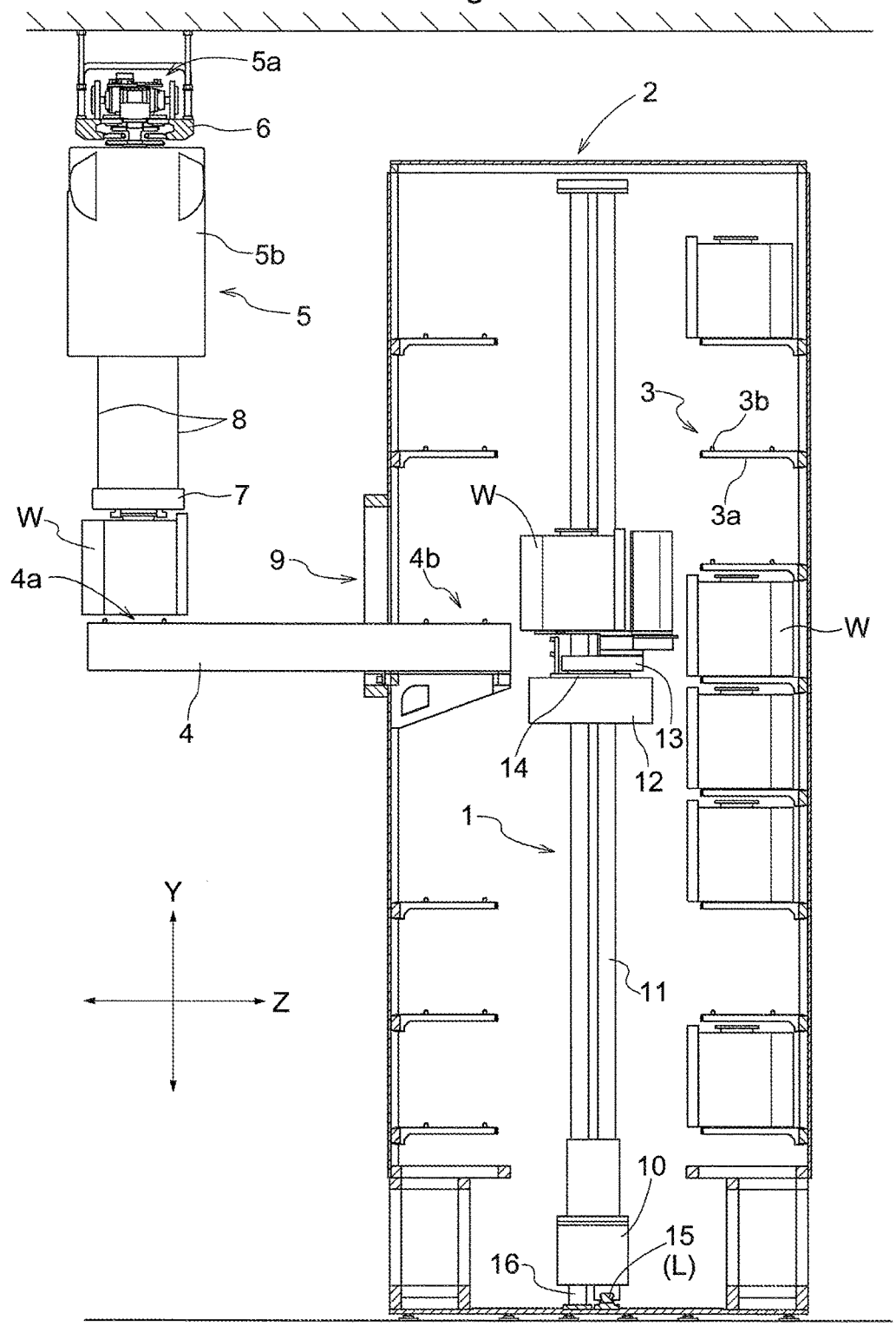
FIG. 1 is an overall side view of an article transport facility.
Figure 2:
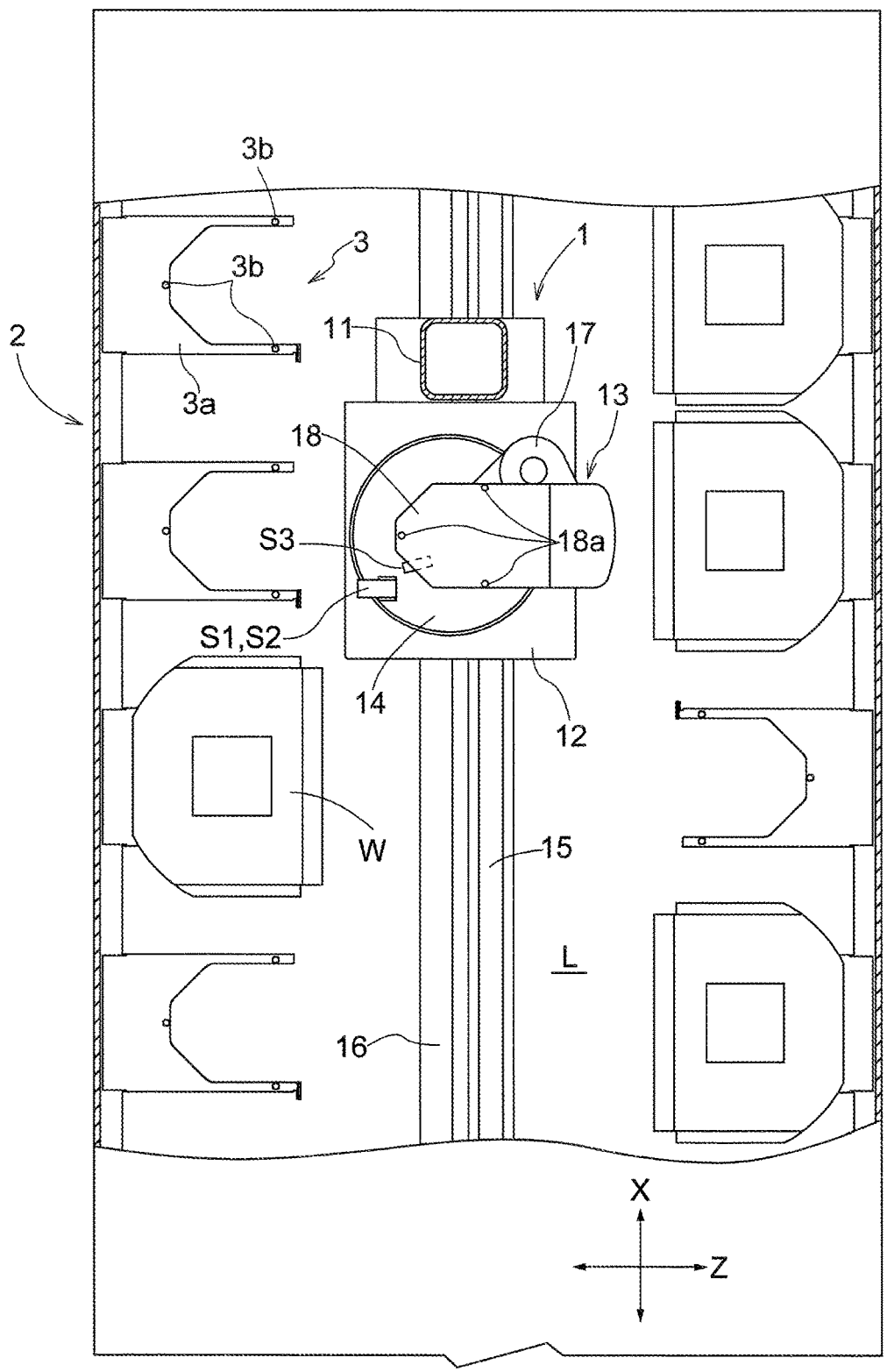
FIG. 2 is a plan view of a main portion of the article transport facility.

(Warehouse) As shown in FIGS. 1 and 2, a plurality of storage portions 3 are arranged in the warehouse 2 in the left-right direction X and the top-bottom direction Y. Each storage portion 3 is provided with a shelf board 3a that supports a container W, and a positioning portion 3b that positions the container W on the shelf board 3a. The positioning portion 3b specifically includes three pins that protrude upward, and the positioning portion 3b supports a container W while positioning the container W, with the pins respectively engaging with elongated groove portions that are radially arranged in the bottom surface of the container W. A fixed position target G, which is constituted by a reflection plate that extends along a vertical surface and indicates a position at which the stacker crane 1 can transfer a container W, is attached to a leading end portion of the shelf board 3a. The fixed position target G will be described later in detail.

In this way, in the present embodiment, the shelf boards 3a are provided as the fixed support portions that are provided in a fixed state and support articles (containers W).

A conveyor 4 that transports a container W between the warehouse 2 and the outside is provided so as to penetrate through a transport port 9 that is formed in a side wall of the warehouse 2. The conveyor 4 is provided with a transport carriage (not shown) that can support a container W mounted thereon, and that moves back and forth between an inner end portion and an outer end portion, and transports a container W between load receiving portions (an outer load receiving portion 4a and an inner load receiving portion 4b) that are provided at the outer end portion and the inner end portion.

(Overhead Transport Vehicle) As shown in FIG. 1, an overhead transport vehicle 5 that travels along an overhead rail 6 is provided outside the warehouse 2. The overhead transport vehicle 5 includes: a travelling portion 5a that is provided with travelling wheels that are guided by the overhead rail 6; and a body portion 5b that is provided below the travelling portion 5a and is connected to the travelling portion 5a. The body portion 5b includes a hoist apparatus that lifts and lowers a lifting/lowering portion 7 in the top-bottom direction Y by reeling out and winding up a lifting/lowering belt 8. Although not shown in the drawings, the lifting/lowering portion 7 is provided with a chuck apparatus that can grip an upper end portion of a container W.

The overhead transport vehicle 5 receives a container W that has been subjected to processing performed by a processing apparatus (not shown) and is to be stored, from a load port of the processing apparatus, and supplies the container W to the outer load receiving portion 4a that is provided at the outer end portion of the conveyor 4. The overhead transport vehicle 5 also receives a container W that is to be processed by the processing apparatus, from the outer load receiving portion 4a, and supplies the container W to a load port of the processing apparatus. A container W to be stored is transported by the conveyor 4 from the outer load receiving portion 4a to the inner load receiving portion 4b that is provided at the inner end portion of the conveyor 4. A container W to be processed is transported by the conveyor 4 from the inner load receiving portion 4b to the outer load receiving portion 4a.

Figure 3:
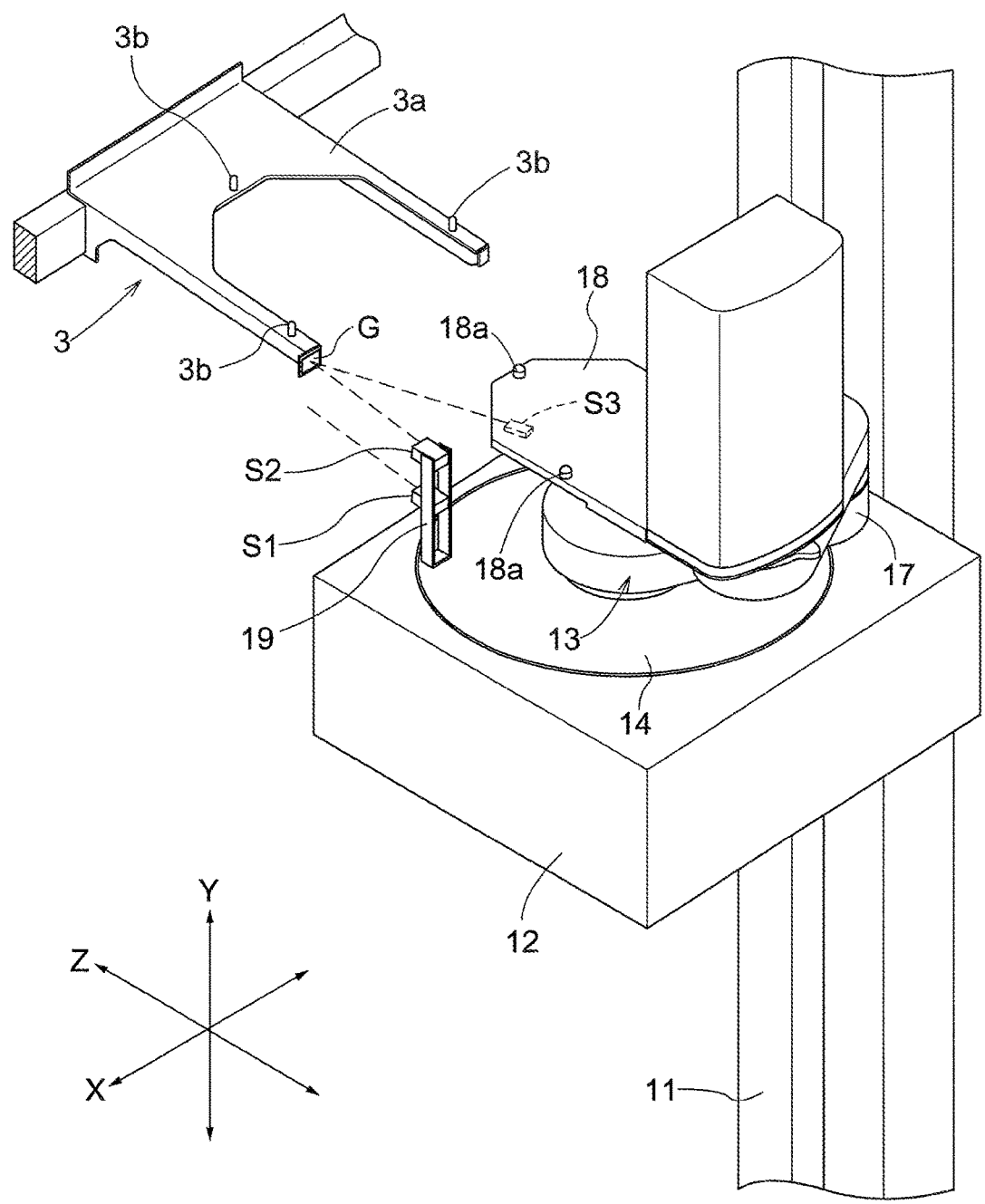
FIG. 3 is a perspective view showing a shelf board and a transport apparatus.

(Stacker Crane) As shown in FIGS. 1 to 3, the stacker crane 1 includes: a travelling carriage 10 that can travel in the left-right direction X along the moving path L; a lifting/lowering mast 11 that stands upright on the travelling carriage 10; a lifting/lowering carriage 12 that can be lifted and lowered in the top-bottom direction Y along the lifting/lowering mast 11; a transfer apparatus 13 that is provided so as to be rotatable about a vertical axis that extends along the lifting/lowering carriage 12 in the top-bottom direction Y; and a rotation portion 14 that supports the transfer apparatus 13 such that the transfer apparatus 13 is rotatable. The travelling carriage 10 is driven by a travelling drive portion 16 so as to travel along the moving path L while being guided by a travelling rail 15 that is provided on a bottom portion of the warehouse 2.

The travelling drive portion 16 according to the present embodiment performs an operation to push and pull the travelling carriage 10 in the left-right direction X by winding up a toothed drive belt, both ends of which are coupled to the travelling carriage 10, using a travelling motor M1 (see FIG. 6) that is provided at an end portion of the moving path L, for example. The travelling drive portion 16 may be configured to move a travelling motor integrally with the travelling carriage 10. The travelling motor is driven to rotate travelling wheels that are provided on the travelling carriage 10. That is, the travelling drive portion 16 needs only to be configured to move the stacker crane 1 in the left-right direction X. Also, the travelling carriage 10 is provided with a travelling position detection unit Dx (see FIG. 6) that detects the travelling position of the travelling carriage 10, and the travelling motor M1 is controlled by the control apparatus H (see FIG. 6) based on detection information obtained by the travelling position detection unit Dx. The travelling position detection unit Dx is constituted by, for example, a travelling distance measurement unit that measures a distance from a reference position in the moving path L in the left-right direction X. The travelling distance measurement unit may be constituted by a rotary encoder that detects the amount of rotation of the travelling motor M1, or an optical ranging apparatus that measures the distance from a reference position, which is set in the vicinity of an end portion of the moving path L, to the travelling carriage 10.

The travelling carriage 10 is provided with a lifting/lowering motor M2 (see FIG. 6) that lifts and lowers the lifting/lowering carriage 12 in the top-bottom direction Y by winding the lifting/lowering belt 8 that is connected to the lifting/lowering carriage 12. The travelling carriage 10 is also provided with a lifting/lowering position detection unit Dy (see FIG. 6) that detects the lifting/lowering position of the lifting/lowering carriage 12, and the lifting/lowering motor M2 is controlled by the control apparatus H (see FIG. 6) based on detection information obtained by the lifting/lowering position detection unit Dy. The lifting/lowering position detection unit Dy is constituted by, for example, a lifting/lowering distance measurement unit that measures the distance from the reference position in a lifting/lowering path. The lifting/lowering distance measurement unit may be constituted by a rotary encoder that detects the amount of rotation of the lifting/lowering motor M2, or an optical ranging apparatus that measures the distance from a reference height, which is set in the vicinity of an end portion of the lifting/lowering path, to the lifting/lowering carriage 12.

(Transfer Apparatus) As shown in FIGS. 1 to 5, the transfer apparatus 13 is supported by the rotation portion 14 that is included in the lifting/lowering carriage 12, so as to be rotatable about a vertical axis that extends in the top-bottom direction Y, and moves integrally with the lifting/lowering carriage 12 in the left-right direction X and the top-bottom direction Y. The rotation portion 14 includes, for example, a turntable that is formed so as to have a disc shape, and a rotary motor M4 (see FIG. 6) that rotates the turntable, and the transfer apparatus 13 is attached to the turntable so as to be able to rotate integrally with the turntable. Therefore, the transfer apparatus 13 is driven to rotate between a first rotational position and a second rotational position integrally with the turntable by the rotary motor M4 that is included in the rotation portion 14.

The first rotational position is a rotational position of the rotation portion 14 (a rotational position of the transfer apparatus 13) at the time the transfer apparatus 13 receives and supplies a container W from and to a storage portion 3 that is located on one side of the moving path L in the protruding/retracting direction Z, and the second rotational position is a rotational position of the rotation portion 14 (a rotational position of the transfer apparatus 13) at the time the transfer apparatus 13 receives and supplies a container W from and to a storage portion 3 that is located on the other side of the moving path L in the protruding/retracting direction Z. The rotational position of the rotation portion 14 is detected by a rotational position detection unit Dr (see FIG. 6). The rotational position detection unit Dr is constituted by a rotary encoder, for example.

The transfer apparatus 13 includes a protruding/retracting support portion 18 that is operated by a protruding/retracting drive portion 17 to move in the protruding/retracting direction Z to protrude and retract, between a protruding position and a retracted position. The retracted position and the protruding position are positions in the protruding/retracting direction Z. The retracted position is the position of the protruding/retracting support portion 18 shown in FIGS. 1 and 2, at which the protruding/retracting support portion 18 is housed within the moving path L in terms of the protruding/retracting direction Z (the widthwise direction). The protruding position is a position at which a container W is received and supplied between a shelf board 3a and the protruding/retracting support portion 18 due to the protruding/retracting support portion 18 being lifted and lowered at the protruding position (the position at which a subject that supports the load of a container W is switched), and a position at which the protruding/retracting support portion 18 protrudes outward from the moving path L in the protruding/retracting direction Z. Note that the protruding/retracting support portion 18 is provided with a positioning portion 18a that supports a container W while positioning the container W. As with the positioning portion 3b of each shelf board 3a, the positioning portion 18a is constituted by three pins that protrude upward.

As shown in FIGS. 2 to 5, the protruding/retracting drive portion 17 includes a bending/stretching arm that is constituted by two links, and a protruding/retracting motor M3 (see FIG. 6) that bends and stretches the bending/stretching arm. The protruding/retracting drive portion 17 may include a slide fork and a motor that operates the slide fork such that the slide fork protrudes and retracts.

Figure 6:
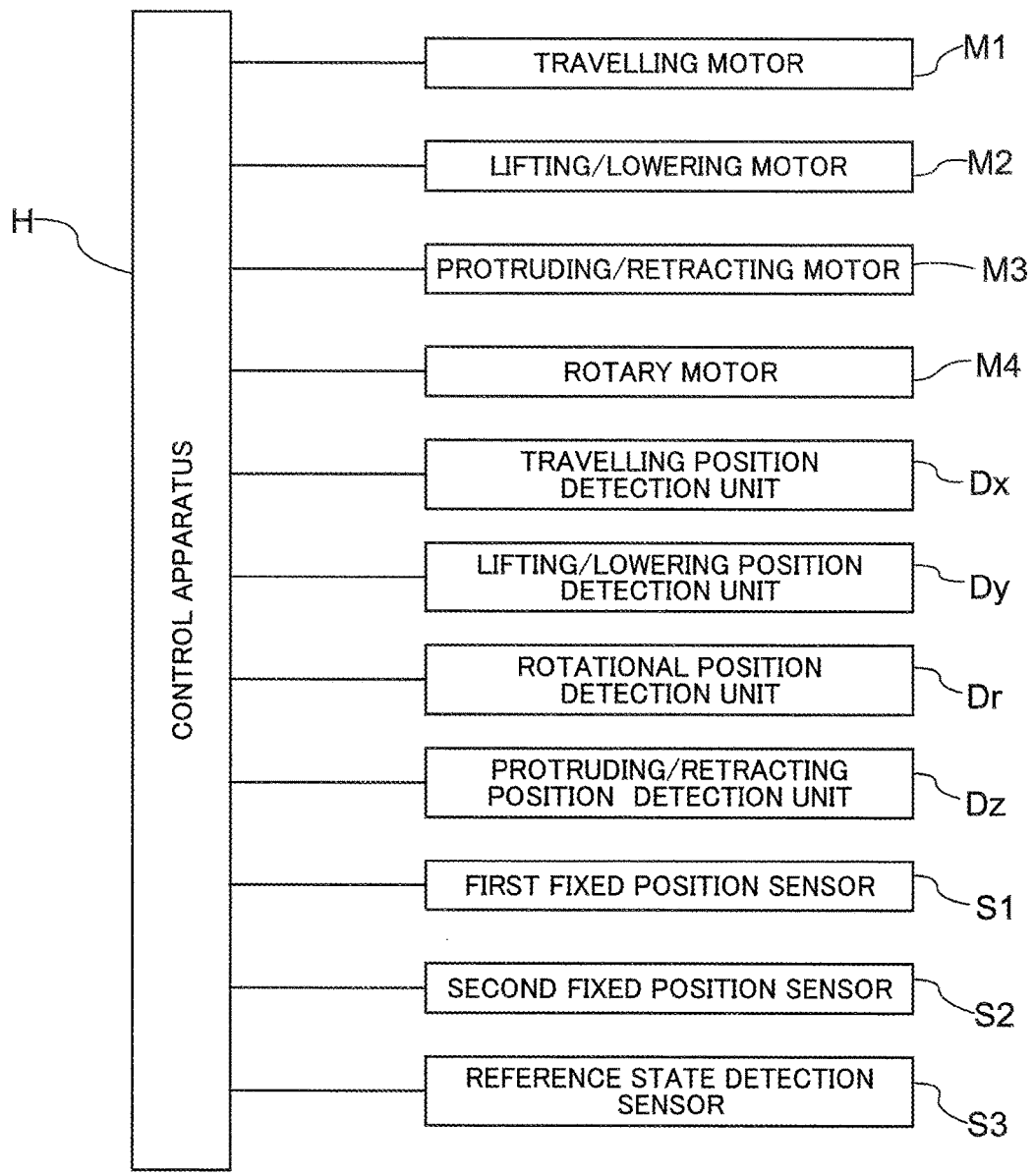
FIG. 6 is a control block diagram.

The position of the protruding/retracting support portion 18 in the protruding/retracting direction Z is detected by a protruding/retracting position detection unit Dz (see FIG. 6). The protruding/retracting position detection unit Dz can detect the position of the protruding/retracting support portion 18 in the protruding/retracting direction Z by detecting the driving amount of the protruding/retracting drive portion 17 relative to the state in which the protruding/retracting support portion 18 is located at the retracted position. Specifically, the protruding/retracting position detection unit Dz is constituted by, for example, a rotary encoder that detects the amount by which the protruding/retracting motor M3 is driven to rotate.

In this way, the transfer apparatus 13 is provided with the protruding/retracting support portion 18 that serves as the moving support portion that moves integrally with the stacker crane 1, such that the protruding/retracting support portion 18 is movable in the widthwise direction (the protruding/retracting direction Z) that is orthogonal to the lengthwise direction of the moving path L (the left-right direction X), within a horizontal plane. The transfer apparatus 13 receives and supplies a container W from and to a shelf board 3a, which serves as the fixed support portion, and from and to the inner load receiving portion 4b, while the protruding/retracting support portion 18 moves between the retracted position, at which the protruding/retracting support portion 18 is housed within the moving path L in terms of the protruding/retracting direction Z, and the protruding position at which the protruding/retracting support portion 18 protrudes outward from the moving path L in the protruding/retracting direction Z. The stacker crane 1 includes the rotation portion 14 that rotates about an axis that extends in the top-bottom direction Y, and the transfer apparatus 13 is provided on the rotation portion 14.

As shown in FIGS. 2 to 5, the transfer apparatus 13 is provided with two fixed position sensors S (a first fixed position sensor S1 and a second fixed position sensor S2). The first fixed position sensor S1 and the second fixed position sensor S2 are attached to a sensor attachment bracket 19 that is fixed to the turntable of the rotation portion 14, so as to be arranged in the top-bottom direction Y. Therefore, the first fixed position sensor S1 and the second fixed position sensor S2 are provided on the stacker crane 1 such that their positions relative to the retracted position of the protruding/retracting support portion 18 are fixed.

The fixed position sensors S are provided at positions at which the fixed position sensors S can detect the fixed position target G on a shelf board 3a if the stacker crane 1 is located within an acceptable stop range in terms of both the left-right direction X and the top-bottom direction Y. The acceptable stop range is a range that includes a target stop position, which is set for the shelf board 3a of each storage portion 3, and is set as a range in which the transfer apparatus 13 can appropriately receive and supply a container W from and to a storage portion 3. On the other hand, the fixed position target G is provided at a position that corresponds to the target stop position for each shelf board 3a. The length of each fixed position target G in the left-right direction X is equal to the length of the acceptable stop range of a target stop position P0 in the left-right direction X, and the length of each fixed position target G in the top-bottom direction Y is equal to the length of the acceptable stop range of a target stop position in the top-bottom direction Y. Thus, the fixed position sensors S can each detect a fixed position target G if the stacker crane 1 is located within the acceptable stop range in terms of both the left-right direction X and the top-bottom direction Y.

In the top-bottom direction Y, two target stop positions, one for a supplying operation and the other for a receiving operation, are set for the same shelf board 3a. That is, the control apparatus H stores two target stop positions for each shelf board 3a. The target stop position for a supplying operation is the position of the lifting/lowering carriage 12 when the transfer apparatus 13 is located at the position shown in FIG. 4, and the target stop position for a receiving operation is the position of the lifting/lowering carriage 12 when the transfer apparatus 13 is located at the position shown in FIG. 5. The positions in the top-bottom direction Y at which the first fixed position sensor S1 and the second fixed position sensor S2 are supported by the sensor attachment bracket 19 are different from each other by a length that is the same as the difference between the target stop position for a supplying operation and the target stop position for a receiving operation in the top-bottom direction Y. The first fixed position sensor S1 detects a fixed position target G when a container W is supplied to a shelf board 3a as shown in FIG. 4, and the second fixed position sensor S2 detects a fixed position target G when a container W is received from a shelf board 3a as shown in FIG. 5.

(Control Apparatus) The stacker crane 1 is provided with the control apparatus H (see FIG. 6). The travelling motor M1, the lifting/lowering motor M2, the protruding/retracting motor M3, and the rotary motor M4 are connected to the control apparatus H as control targets, and the travelling position detection unit Dx, the lifting/lowering position detection unit Dy, the rotational position detection unit Dr, and the protruding/retracting position detection unit Dz are connected to the control apparatus H as input sources that are used to control the control targets.

Upon receiving a load instruction to load a container W (an instruction to transport a container W from the inner load receiving portion 4b, which is the transport source, to a shelf board 3a, which is the transport destination) or an unload instruction to unload a container W (an instruction to transport a container W from a shelf board 3a, which is the transport source, to the inner load receiving portion 4b, which is the transport destination) from a transport management apparatus (not shown), the control apparatus H executes empty movement control, first rotation control, receiving control, actual movement control, second rotation control, and supplying control, which will be described below. The empty movement control is control that is executed to move the transfer apparatus 13 that is not supporting a container W, to the transport destination. The first rotation control is control that is executed to change the orientation of the transfer apparatus 13 to the rotational position of the transfer apparatus 13 corresponding to the position of the transport source. The receiving control is control that is executed to receive a container W that is to be transported, from the transport source. The actual movement control is control that is executed to move the transfer apparatus 13 that supports a container W that is to be transported, to the transport destination. The second rotation control is control that is executed to change the orientation of the transfer apparatus 13 to the rotational position of the transfer apparatus 13 corresponding to the position of the transport destination. The supplying control is control that is executed to supply a container W that is to be transported, to the transport destination.

In the present embodiment, shelf boards 3a are located on both sides of the moving path L in the protruding/retracting direction Z. The control apparatus H executes the first rotation control and the second rotation control according to the positions of the shelf boards 3a that are the transport source and the transport destination of a load instruction and an unload instruction, to change the orientation of the transfer apparatus 13 to the rotational position (the first rotational position or the second rotational position) corresponding to one of the orientations in the protruding/retracting direction Z, and thus a container W can be supplied or received to and from all the shelf boards 3a.

A load instruction and an unload instruction for cases in which the transport source and the transport destination are located on the same side with respect to the moving path L do not require the rotational position of the transfer apparatus 13 to be changed, and the second rotation control is not executed in such cases. The first rotation control and the second rotation control are executed when the protruding/retracting support portion 18 is located at the retracted position. It is preferable that the first rotation control and the empty movement control are executed in parallel during the same period, and it is preferable that the second rotation control and the actual movement control are executed in parallel during the same period. However, depending on the positions of the transport source and the transport destination, the first rotation control may be complete after the empty movement control has been completed, and the second rotation control may be complete after the actual movement control has been completed. Also, the empty movement control may be started after the first rotation control has been completed, and the actual movement control may be started after the second rotation control has been completed.

In the empty movement control, the control apparatus H executes travelling control and lifting/lowering control to position the transfer apparatus 13 at the target stop position at the transport source. That is, the control apparatus H executes the travelling control to control the travelling motor M1 based on detection information obtained by the travelling position detection unit Dx, to position the transfer apparatus 13 at the target stop position P0 in the left-right direction X, and executes the lifting/lowering control to control the lifting/lowering motor M2 based on detection information obtained by the lifting/lowering position detection unit Dy, to position the transfer apparatus 13 at the target stop position in the top-bottom direction Y.

In the actual movement control, the control apparatus H executes travelling control and lifting/lowering control to position the transfer apparatus 13 at the target stop position at the transport destination. That is, the control apparatus H executes the travelling control to control the travelling motor M1 based on detection information obtained by the travelling position detection unit Dx, to position the transfer apparatus 13 at the target stop position P0 in the left-right direction X, and executes the lifting/lowering control to control the lifting/lowering motor M2 based on detection information obtained by the lifting/lowering position detection unit Dy, to position the transfer apparatus 13 at the target stop position in the top-bottom direction Y.

In the travelling control, the travelling motor M1 is controlled according to a speed change pattern that is determined based on the distance between the transport source and the transport destination in the left-right direction X. The speed change pattern indicates changes in the travelling speed that sequentially transitions to: an acceleration state that starts when travelling starts and ends when a preset upper limit speed is reached; a constant speed state in which the preset upper limit speed is kept; and a deceleration state in which the preset upper limit speed decreases until travelling ends. The control apparatus H executes starting control in the acceleration state, constant control in the constant speed state, and deceleration control in the deceleration state. FIG. 8 shows a portion of the speed change pattern that indicates changes in the speed of the travelling carriage 10 from when the travelling carriage 10 is in the constant speed state in which the constant control is executed, to when the execution of the stopping control is started, the travelling carriage 10 transitions to the deceleration state, and the travelling carriage 10 stops.

As shown in the flowchart in FIG. 7, upon the travelling carriage 10 reaching a deceleration start position P3 (step #1), the control apparatus H starts deceleration according to a preset deceleration speed that is indicated by the speed change pattern, and the travelling carriage 10 enters the deceleration state (step #2). Upon the travelling carriage 10 in the deceleration state reaching a low speed travelling start position P1 (step #3), the control apparatus H causes the travelling carriage 10 to travel at a preset low speed that is indicated by the speed change pattern (step #4). Upon the travelling carriage 10 reaching the target stop position P0 (step #5), the control apparatus H stops the travelling carriage 10 (step #6). After stopping the travelling carriage 10, the control apparatus H checks the detection state of the fixed position sensors S if the lifting/lowering control has been completed. If the fixed position sensors S have not detected a fixed position target G (No in step #7), the control apparatus H determines that the stacker crane 1 is not located within the acceptable stop range of the target stop position in the left-right direction X or the top-bottom direction Y, and outputs an error (step #8).

Note that, in step #7, in the case where the transfer apparatus 13 is positioned at the target stop position (the position shown in FIG. 4) at the transport destination where an operation to supply a container W is to be performed, the control apparatus H checks the detection state of the first fixed position sensor S1, and in the case where the transfer apparatus 13 is positioned at the target stop position (the position shown in FIG. 5) at the transport source where an operation to receive a container W is to be performed, the control apparatus H checks the detection state of the second fixed position sensor S2.

The control apparatus H executes protrusion control, lifting control, and retraction control in the receiving control. That is, the control apparatus H executes: protrusion control to control the protruding/retracting motor M3 based on detection information obtained by the protruding/retracting position detection unit Dz, to move the protruding/retracting support portion 18 from the retracted position to the protruding position; lifting control to control the lifting/lowering motor M2 to lift the transfer apparatus 13 from the target stop position where a receiving operation is to be performed to the target stop position where a supplying operation is to be performed; and retraction control to control the protruding/retracting motor M3 based on detection information obtained by the protruding/retracting position detection unit Dz, to move the protruding/retracting support portion 18 from the protruding position to the retracted position.

The control apparatus H executes protrusion control, lowering control, and retraction control in the supplying control. That is, the control apparatus H executes: protrusion control to control the protruding/retracting motor M3 based on detection information obtained by the protruding/retracting position detection unit Dz, to move the protruding/retracting support portion 18 from the retracted position to the protruding position; lowering control to control the lifting/lowering motor M2 to lower the transfer apparatus 13 from the target stop position where a supplying operation is to be performed to the target stop position where a receiving operation is to be performed; and retraction control to control the protruding/retracting motor M3 based on detection information obtained by the protruding/retracting position detection unit Dz, to move the protruding/retracting support portion 18 from the protruding position to the retracted position.

In this way, the control apparatus H performs stopping control to stop the stacker crane 1 at the target stop position P0, and protrusion control to move the protruding/retracting support portion 18 of the transfer apparatus 13 from the retracted position to the protruding position at which the protruding/retracting support portion 18 protrudes. That is, the control apparatus H serves as the control unit.

In the article transport facility according to the present embodiment, the protrusion control in the receiving control is started before the stopping control in the travelling control in the empty movement control has been completed, and the protrusion control in the supplying control is started before the stopping control in the travelling control in the actual movement control has been completed, so that the receiving of a container W at the transport source and the supply of a container W at the transport destination can be performed as quickly as possible.

Figure 10:
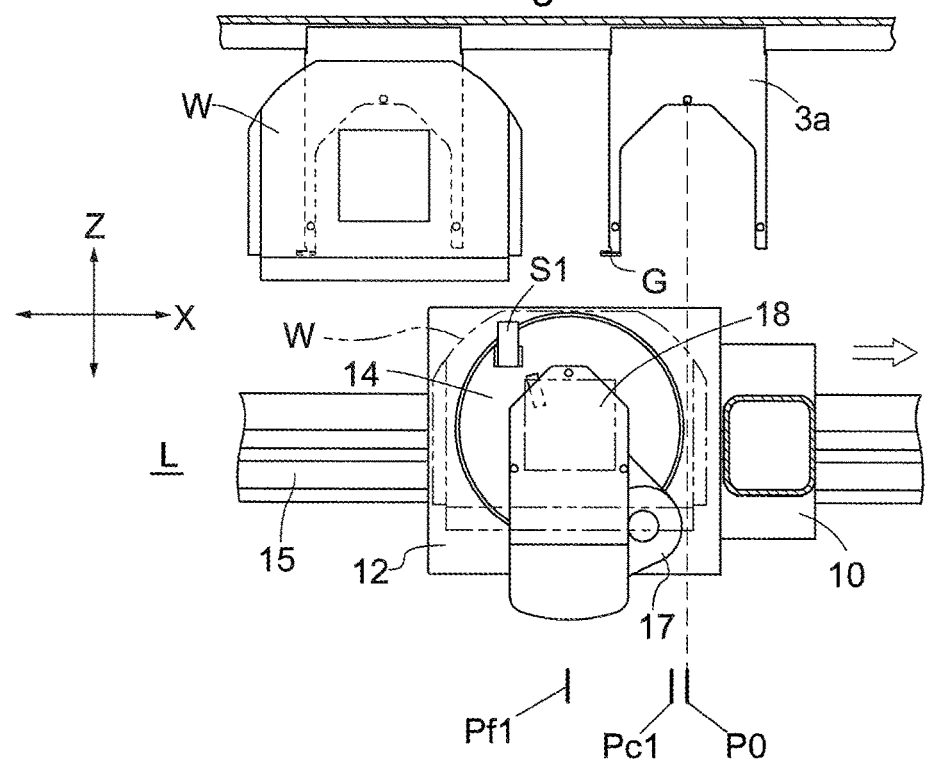
FIG. 10 is a diagram illustrating a protrusion start position, a protrusion monitoring start position, and a target stop position in actual movement control.

Specifically, upon the travelling carriage 10 of the stacker crane 1 reaching a protrusion start position Pf (Pf1 in FIG. 10 and Pf2 in FIG. 11) as a result of the stopping control, the control apparatus H starts executing the protrusion control even if the stacker crane 1 has not stopped at the target stop position P0 in the left-right direction X as a result of the stopping control. The protrusion start position Pf is set upstream of a target stop position P0 with respect to the left-right direction X, in the direction in which the travelling carriage 10 travels. However, if one of; a rotation completion condition, which is the condition that the rotational position of the transfer apparatus 13 (the rotational position of the rotation portion 14) is located at the target rotational position; and a lifting/lowering condition, which is the condition that the lifting/lowering position of the transfer apparatus 13 (the lifting/lowering position of the lifting/lowering carriage 12) is located at the target lifting/lowering position, is not satisfied, the control apparatus H suspends the execution of protrusion control until both conditions are satisfied, even after the travelling carriage 10 has travelled past the protrusion start position Pf. The control apparatus H starts the execution of protrusion control when both conditions are satisfied.

The lifting/lowering mast 11 vibrates immediately before and after the stacker crane 1 stops at the target stop position, as the lifting/lowering mast 11 deforms due to inertia. If the vibrations are large, there is the possibility of the transfer apparatus 13 being displaced in the left-right direction X relative to a shelf board 3a to the extent that a container W cannot be appropriately supplied to or received from the shelf board 3a. Therefore, after starting the protrusion control, the control apparatus H executes monitoring control after the travelling carriage 10 has travelled past a protrusion monitoring start position Pc (a supply protrusion monitoring start position Pc1 in FIG. 10 and a receiving protrusion monitoring start position Pc2 in FIG. 11) at which the fixed position sensors S can detect the fixed position target G, to monitor whether or not it is possible to continue the protrusion control.

In the monitoring control, if the fixed position sensors S do not detect a fixed position target G, the control apparatus H determines that the transfer apparatus 13 is in the state where the displacement is large and the protrusion control should not be continued, and suspends the execution of the protrusion control. After the protrusion control has been suspended, upon the fixed position sensors S detecting a fixed position target G again, the control apparatus H determines that the transfer apparatus 13 has returned to a state in which the displacement of the transfer apparatus 13 is small and the protrusion control should be continued, and resumes the execution of the protrusion control.

Specifically, after the control apparatus H has started the execution of the protrusion control and the travelling carriage 10 has travelled past the protrusion monitoring start position Pc, the control apparatus H suspends the execution of the protrusion control upon the fixed position sensors S no longer detecting the fixed position target G. Furthermore, even after the stacker crane 1 has stopped at the target stop position P0 as a result of the stopping control, the control apparatus H suspends the execution of the protrusion control upon the fixed position sensors S no longer detecting the fixed position target G. After suspending the execution of the protrusion control, the control apparatus H resumes the execution of the protrusion control upon the fixed position sensors S detecting the fixed position target G again.

In this way, after the travelling carriage 10 of the stacker crane 1 has reached the protrusion monitoring start position Pc, which is downstream of the protrusion start position Pf in the travelling direction toward the target stop position P0, and at which the fixed position sensors S can detect a fixed position target G, the control apparatus H continues the execution of the protrusion control as long as the fixed position sensors S detect a fixed position target G, until the protrusion control is complete. Thus, a shelf board 3a that is located next to a shelf board 3a at the transport source or the transport destination in the left-right direction X, and a container W that is supported by the aforementioned next shelf board 3a, are prevented from interfering with the protruding/retracting support portion 18 and a container W that is supported by the protruding/retracting support portion 18.

The actual movement control and the empty movement control are different from each other in terms of whether or not a container W is present on the protruding/retracting support portion 18. Therefore, in view of this point, in the present embodiment, the supplying protrusion start position Pf1 or the receiving protrusion start position Pf2 is selectively set as the protrusion start position Pf according to the type of movement control (the empty movement control or the actual movement control) (see FIGS. 10 and 11). The receiving protrusion start position Pf2 is a protrusion start position from which the distance to the target stop position P0 is longer than from the supplying protrusion start position Pf1. The receiving protrusion start position Pf2 is a protrusion start position Pf that is set for a receiving operation that is performed to receive a container W that is supported by a shelf board 3a, using the protruding/retracting support portion 18 of the transfer apparatus 13. The receiving protrusion start position Pf2 is set before the start of the execution of the empty movement control. The supplying protrusion start position Pf1 is a protrusion start position Pf that is set for a supplying operation that is performed to supply a container W that is supported by the protruding/retracting support portion 18 of the transfer apparatus 13 to a shelf board 3a, using the transfer apparatus 13. The supplying protrusion start position Pf1 is set before the start of the execution of the actual movement control.

As described above, the protrusion control is started upon the travelling carriage 10 reaching the protrusion start position Pf as a result of the stopping control that is performed in the empty movement control or the actual movement control, in the state where the rotation control and the lifting/lowering control have been completed. Here, during the empty movement control, the protruding/retracting support portion 18 does not support a container W, and therefore an area in which the protruding/retracting support portion 18 does not interfere with a container W that is supported by a shelf board 3a (the shelf board 3a on the left in FIG. 11) that is next to the shelf board 3a at the destination, in the left-right direction X (which is the shelf board 3a on the right in FIG. 11, and is the shelf board 3a at the transport source of the container W) is larger than an area in which, in the actual movement control, the protruding/retracting support portion 18 does not interfere with a container W that is supported by a shelf board 3a (the shelf board 3a on the left in FIG. 10) that is next to the shelf board 3a at the destination, in the left-right direction X (which is the shelf board 3a on the right in FIG. 10, and is the shelf board 3a at the transport destination of the container W). Therefore, it is possible to start the protrusion control relatively early, and move the protruding/retracting support portion 18 farther in the protruding/retracting direction Z relative to the position of the travelling carriage 10 in the left-right direction X. Hence, the distance from the receiving protrusion start position Pf2 to the target stop position P0 is set to be longer than the distance from the supplying protrusion start position Pf1 to the target stop position P0 so that the protrusion control can start sooner.

Figure 11:
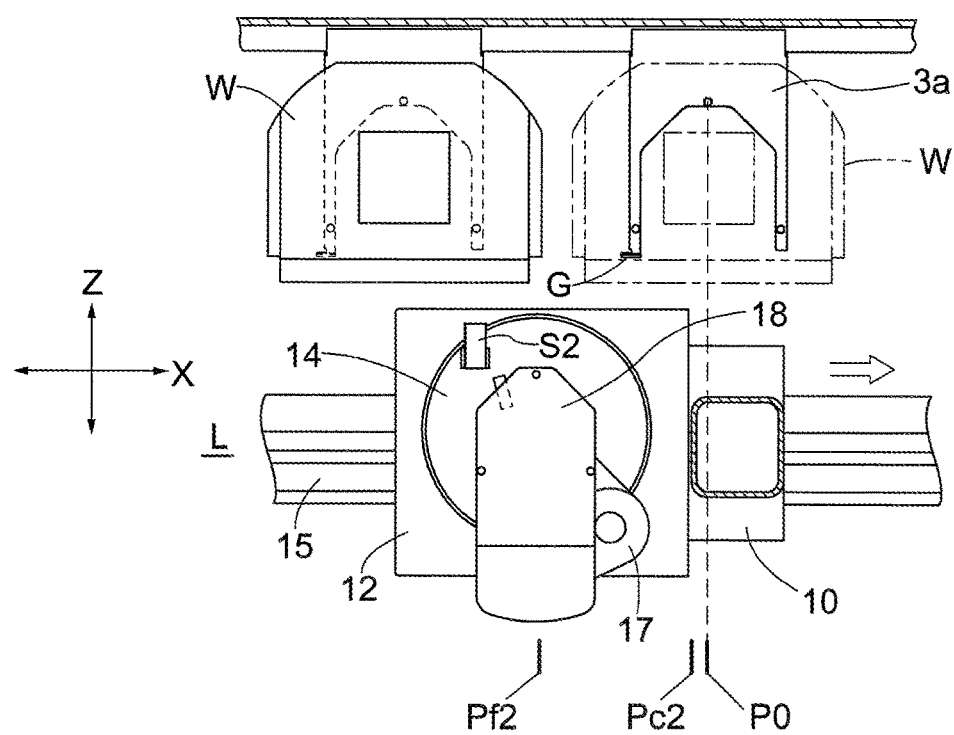
FIG. 11 is a diagram illustrating a protrusion start position, a protrusion monitoring start position, and a target stop position in empty movement control.

As described above, the protrusion start position Pf is different in the empty movement control and in the actual movement control, whereas the protrusion monitoring start position Pc is the same in the empty movement control and in the actual movement control. That is, the supplying protrusion monitoring start position Pc1 in FIG. 10 and the receiving protrusion monitoring start position Pc2 in FIG. 11 are set at the same position relative to the target stop position P0 in the left-right direction X. Therefore, a delay time Td shown in FIG. 12, from the start of the protrusion control to the start of the monitoring control, is different in the empty movement control and in the actual movement control. That is, the delay time Td between the protrusion control and the monitoring control that are started during execution of the stopping control in the empty movement control is longer than the delay time Td between the protrusion control and the monitoring control that are started during execution of the stopping control in the actual movement control. That is, the time from the start of the protrusion control to the start of the monitoring control is relatively long when a supplying operation is performed, compared to when a receiving operation is performed. Therefore, the position of the protruding/retracting support portion 18 in the protruding/retracting direction Z when the monitoring control is started is closer to the protruding position when the protrusion control is performed in the receiving control than when the protrusion control is performed in the supplying control. Thus, it is possible to quickly complete the receiving operation.

Figure 9:
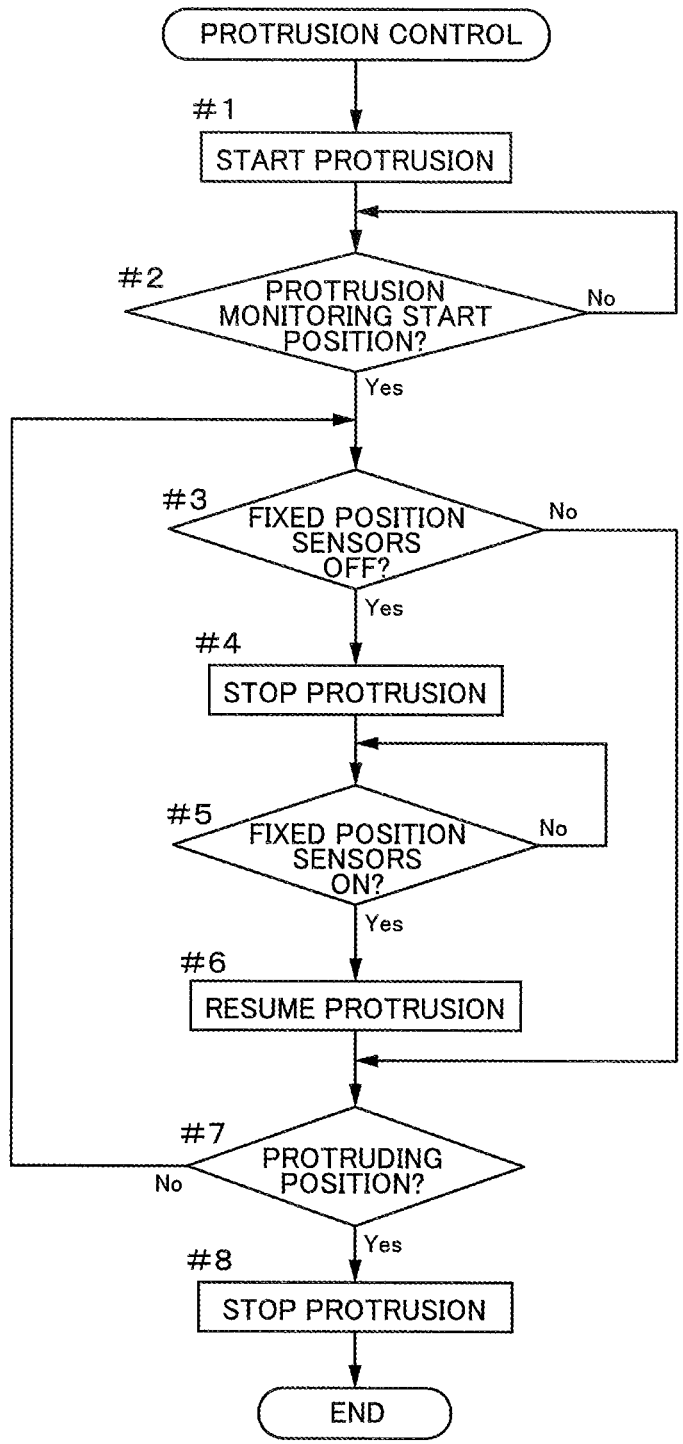
FIG. 9 is a flowchart for protrusion control.

The following describes the protrusion control executed by the control apparatus H with reference to the flowchart shown in FIG. 9 and the timing chart shown in FIG. 12. The protrusion control is started upon the travelling carriage 10 being positioned at the protrusion start position Pf during execution of the stopping control in the state where the lifting/lowering control and the rotation control have been completed. First, the protruding/retracting motor M3 is driven to rotate in the rotation direction toward the protruding side, and thus the protruding/retracting support portion 18 at the retracted position is moved to the protruding position in the protruding/retracting direction Z, by the protruding/retracting drive portion 17 (step #1). Thereafter, upon the travelling carriage 10 being positioned at the protrusion monitoring start position Pc (Yes in step #2), the execution of the monitoring control is started to monitor the detection state of the fixed position sensors S (step #3).

In the case of the protrusion control in the supplying control, the execution of the monitoring control is started to monitor the detection state of the first fixed position sensor S1 upon the travelling carriage 10 reaching the supplying protrusion monitoring start position Pc1 after reaching the supplying protrusion start position Pf1. In the case of the protrusion control in the receiving control, the execution of the monitoring control is started to monitor the detection state of the second fixed position sensor S2 upon the travelling carriage 10 reaching the receiving protrusion monitoring start position Pc2 after reaching the receiving protrusion start position Pf2. As shown in FIG. 12, there is the delay time Td from when the protrusion control is started to when the monitoring control is started. As described above, the delay time Td is longer when the receiving control is executed than when the supplying control is executed.

If a state in which the fixed position sensors S do not detect a fixed position target G occurs during execution of the monitoring control (Yes in step #3), the protruding operation performed by the protruding/retracting support portion 18 is suspended (step #4), and the position of the protruding/retracting support portion 18 in the protruding/retracting direction Z is maintained until the fixed position sensors S return to the state in which they detect a fixed position target G again (No in step #5). Upon the fixed position sensors S returning to the state in which they detect the fixed position target G again (Yes in step #5), the protruding operation performed by the protruding/retracting support portion 18 is resumed (step #6). Then, the protruding operation performed by the protruding/retracting support portion 18 is continued as long as the fixed position sensors S are continuously detecting the fixed position target G (No in step #3 and No in step #7), until the protruding/retracting support portion 18 reaches the protruding position. Upon the protruding/retracting support portion 18 reaching the protruding position (Yes in step #7), the protruding operation performed by the protruding/retracting support portion 18 stops (step #8).

FIG. 12 shows an example in which the state in which the fixed position sensors S do not detect the fixed position target G occurs twice in total after the execution of the protrusion control has been started, during a period from when the travelling carriage 10 reaches the protrusion monitoring start position Pc to when the protruding/retracting support portion 18 reaches the protruding position. The first instance occurs before the travelling carriage 10 stops at the target stop position P0, and the second instance occurs after the travelling carriage 10 stops at the target stop position P0. FIG. 12 shows that the protrusion control is suspended and the amount of protrusion of the protruding/retracting support portion 18 does not change during a period in which the fixed position sensors S do not detect the fixed position target G, even after the travelling carriage 10 has stopped at the target stop position P0, i.e. after the stopping control has been completed.

Although not illustrated in FIG. 12, the control apparatus H does not suspend the protrusion control even if a state in which the fixed position sensors S do not detect a fixed position target G occurs after the protrusion control has been started and before the monitoring control is started. This is because the protruding/retracting support portion 18 has not reached a position where the protruding/retracting support portion 18 interferes with the shelf board 3a or the stored container W in the protruding/retracting direction Z, and there is no need to stop the movement of the protruding/retracting support portion 18.

Although a detailed description is omitted, after the protrusion control has been completed, the control apparatus H executes: lifting/lowering control (lifting control in receiving control, and lowering control in supplying control) by which the lifting/lowering carriage 12 is lifted/lowered with the protruding/retracting support portion 18 being located at the protruding position; retraction control by which the protruding/retracting support portion 18 is moved from the protruding position to the retracted position; and actual movement control or empty movement control by which the travelling carriage 10 of the stacker crane 1 is moved to the next target stop position. In this case, it is preferable that the retraction control is started before the lifting control in the receiving control or the lowering control in the supplying control has been completed, and the starting control, which is the initial control in the travelling control, in the moving control is started before the retraction control has been completed. FIG. 12 shows that the execution of the starting control is started before the retraction control has been completed.

In the article transport facility according to the present embodiment, as shown in FIGS. 2 to 5, a reference state detection sensor S3 that detects a fixed position target G is provided in a fixed state on the lower surface of the protruding/retracting support portion 18 as a second detection unit. As shown in FIGS. 3 and 5, the reference state detection sensor S3 is located at a position where the reference state detection sensor S3 can detect a fixed position target G when the stacker crane 1 is located within the acceptable stop range of the target stop position for the receiving operation and the protruding/retracting support portion 18 is located at the retracted position. As shown in FIG. 6, the reference state detection sensor S3 is electrically connected to the control apparatus H.

After continuously operating for a predetermined period, the control apparatus H executes reference state checking processing during a period in which the control apparatus H waits for a load instruction or an unload instruction. In reference state checking processing, the transfer apparatus 13 in which the protruding/retracting support portion 18 is located at the retracted position is positioned at the target stop position for a receiving operation for a given shelf board 3a, in terms of both the left-right direction X and the top-bottom direction Y, and in such a state, whether or not the reference state detection sensor S3 is detecting a fixed position target G is determined.

If the transfer apparatus 13 of the stacker crane 1 is located within the acceptable stop range of the target stop position for a receiving operation in terms of both the left-right direction X and the top-bottom direction Y, and the protruding/retracting support portion 18 is located at the retracted position, the reference state detection sensor S3 should detect the fixed position target G. Therefore, if an abnormality occurs in the protruding/retracting support portion 18 regarding the attachment state thereof, for example, the control apparatus H can detect the abnormality by checking the detection state of the reference state detection sensor S3 by performing reference state checking processing.

Therefore, the control apparatus H determines that, for example, the orientation of the protruding/retracting support portion 18 at the retracted position is normal if the reference state detection sensor S3 is detecting the fixed position target G, and is abnormal if the reference state detection sensor S3 is not detecting the fixed position target G. Specifically, if the reference state detection sensor S3 is not detecting the fixed position target G, the control apparatus H determines that there is an abnormality, such as an abnormality in the protruding/retracting support portion 18 regarding the attachment state thereof relative to the transfer apparatus 13, an abnormality in the transfer apparatus 13 regarding the attachment state thereof to the rotation portion 14, or an abnormality in the control system for the travelling carriage 10, the lifting/lowering carriage 12, the rotation portion 14, and the transfer apparatus 13. Thus, it is possible to regularly check whether or not the supplying control and the receiving control can be appropriately performed.

As described above, with the article transport facility according to the present embodiment, it is possible to receive a container W at a transport source and supply a container W to a transport destination as quickly as possible by starting the execution of the protrusion control as early as possible, while preventing a shelf board 3a that is next to the shelf board 3a at the transport destination or the transport source of a container W, in the left-right direction X, and a container W that is supported by the aforementioned next shelf board 3a, from interfering with the protruding/retracting support portion 18 or a container W supported by the protruding/retracting support portion 18.

(Other Embodiments) Although an exemplary embodiment of the article transport facility has been specifically described above, the article transport facility is not limited to the above-described embodiment, and may be variously modified without departing from the spirit of the present invention. The following illustrates other embodiments. Of course, various embodiments, including the above-described embodiment, may be combined as long as no contradiction occurs.

(1) Although a movement in the left-right direction X is illustrated in the description above, the direction of movement may be the top-bottom direction Y. That is, in addition to or instead of a configuration in which, as in the embodiment above, the control apparatus H starts the protrusion control and thereafter executes monitoring processing upon the travelling carriage 10 reaching the protrusion start position Pf during execution of the stopping control in the state where the lifting/lowering control and the rotation control have been completed, it is possible to employ a configuration in which the control apparatus H starts the protrusion control and thereafter executes monitoring processing upon the lifting/lowering carriage 12 being positioned at the protrusion start position in the top-bottom direction Y during execution of the stopping control in the lifting/lowering control in the state where the travelling control and the rotation control have been completed. If this configuration is employed, monitoring processing continues until the protrusion control is complete even after the lifting/lowering control has been completed. Note that, if the direction of movement is the top-bottom direction Y, it is preferable that the length of the fixed position target G in the top-bottom direction Y is elongated as appropriate.

(2) In the description above, an embodiment in which a shelf board 3a is provided as the fixed support portion is illustrated. However, the inner load receiving portion 4b may serve as the fixed support portion. That is, it is possible to employ a configuration in which, in the case where a container W is supplied to the inner load receiving portion 4b, or in the case where a container W is received from the inner load receiving portion 4b, the protrusion control is started upon reaching the protrusion start position Pf that is set upstream of the target stop position P0 for the inner load receiving portion 4b in the direction in which the travelling carriage 10 travels, and monitoring processing is performed thereafter.

(3) The description above illustrates an embodiment in which the stacker crane, which is a moving member, moves the transfer apparatus, that is, an embodiment in which the transfer apparatus is moved by the travelling carriage of the stacker crane performing a travelling operation and the lifting/lowering carriage of the stacker crane performing a lifting/lowering operation. However, the moving member may be a transport carriage that moves on a floor surface or a ceiling along a moving path that includes a curved portion, or a lifting/lowering member that moves along a straight moving path that extends along the top-bottom direction.

(4) Although the description above illustrates an embodiment in which the moving path is arranged such that the lengthwise direction of the moving path extends along a horizontal plane, the moving path may be arranged such that the lengthwise direction of the moving path extends in the top-bottom direction. If this is the case, three or more directions can be set as the widthwise direction that is orthogonal to the lengthwise direction of the moving path within a horizontal plane. For example, by employing a configuration in which three or more fixed support portions are arranged so as to surround the moving path in plan view, and the orientation of the transfer apparatus is switched to a plurality of rotational positions corresponding to the plurality of positions of the fixed support portions, using a rotation portion that rotates the transfer apparatus about a vertical axis, it is possible to set three or more moving directions as the direction in which the moving support portion moves, corresponding to the plurality of rotational positions.

(5) Although the description above illustrates an embodiment in which the transfer apparatus is provided on the rotation portion, it is possible to provide the transfer apparatus on the moving member without providing a rotation portion such that the orientation of the transfer apparatus in plan view is fixed relative to the moving member.

(Overview of Embodiments) The following briefly describes an overview of the article transport facility described above.

One aspect is an article transport facility including:

a fixed support portion that is provided in a fixed state and supports an article;

a moving member that moves along a moving path that extends via a stop position that is set for the fixed support portion;

a transfer apparatus that is provided with a moving support portion configured to move integrally with the moving member along a widthwise direction that is orthogonal to a lengthwise direction of the moving path within a horizontal plane, and receives and supplies an article from and to the fixed support portion while the moving support portion moves to protrude and retract between a retracted position at which the moving support portion is housed within the moving path in terms of the widthwise direction and a protruding position at which the moving support portion protrudes outward from the moving path in the widthwise direction; and a control unit that controls movement of the moving member and a transfer operation that is performed by the transfer apparatus, the control unit executing stopping control to stop the moving member at the stop position, and protrusion control to move the moving support portion of the transfer apparatus from the retracted position to the protruding position.

The article transport facility further includes:

a detection target member that is provided at a position corresponding to the stop position, and has a length that is equal to a length of an acceptable stop range that is an acceptable range of the stop position, in the lengthwise direction; and a detection unit that is provided on the moving member, at a fixed position relative to the retracted position, and detects the detection target member with the moving member being located within the acceptable stop range, and the control unit starts execution of the protrusion control upon the moving member reaching a protrusion start position as a result of the stopping control, the protrusion start position being set upstream of the stop position in a direction in which the moving member moves, and after the moving member has reached a protrusion monitoring start position that is set downstream of the protrusion start position in the direction in which the moving member moves toward the stop position, the control unit continues the execution of the protrusion control as long as the detection unit is detecting the detection target member.

With this configuration, the protrusion control is started upon the moving member reaching the protrusion start position, before the moving member reaches the stop position as a result of the stopping control executed by the control unit. Therefore, it is possible to start the protrusion control earlier, reduce the time required to perform a receiving operation and a supplying operation after the moving member has stopped at the stop position, and thus it is possible to improve the efficiency of article transportation. The detection target member is located at a position corresponding to the stop position, and has a length that is equal to the length of an acceptable stop range that is an acceptable range of the stop position, in the lengthwise direction. The detection unit detects the detection target member with the moving member being located within the acceptable stop range, which is the acceptable range of the stop position. Therefore, if the detection unit detects the detection target member, the control unit can determine that the moving member is located within the acceptable stop range. Therefore, the control unit can determine whether or not to continue the execution of the protrusion control that has already been started, by monitoring whether or not the detection unit is detecting the detection target portion, after the moving member has reached the protrusion monitoring start position. In addition, the detection unit is provided on the moving member, at a fixed position relative to the retracted position. Therefore, the position of the detection unit does not change even if the moving support portion moves between the retracted position and the protruding position in the widthwise direction, and the detection function of the detection unit is unlikely to be affected even if the attachment state of the moving support portion changes upon impact or over time. Therefore, it is possible to appropriately determine whether or not the moving member is located within the acceptable stop range, to appropriately determine whether or not to continue the protrusion control. In this way, with this configuration, it is possible to obtain an article transport facility that can appropriately determine whether or not to continue the protrusion control after starting the protrusion control, before the stopping control has been completed.

It is preferable that the control unit suspends the execution of the protrusion control upon the detection unit no longer detecting the detection target member, even after the moving member has stopped at the stop position as a result of the stopping control.

With this configuration, if the moving member continues to wobble after stopping, the protrusion control is suspended upon the moving member moving out of the acceptable stop range. Consequently, it is possible to prevent the moving support portion from travelling toward the protruding position in an inappropriate state, not only until the moving member stops, but also after the moving member stops.

It is also preferable that the control unit resumes the execution of the protrusion control upon the detection unit detecting the detection target member again after the control unit has suspended the execution of the protrusion control.

With this configuration, the protrusion control that has been suspended is resumed upon the moving member returning to a position within the acceptable stop range. Therefore, it is possible to move the moving support portion to the protruding position while preventing the moving support portion from moving toward the protruding position in an inappropriate state.

It is also preferable that the control unit is configured to selectively set a receiving protrusion start position or a supplying protrusion start position as the protrusion start position, the receiving protrusion start position is the protrusion start position that is set for a receiving operation that is performed to receive an article that is supported by the fixed support portion, using the moving support portion of the transfer apparatus, the supplying protrusion start position is the protrusion start position that is set for a supplying operation that is performed to supply an article that is supported by the moving support portion of the transfer apparatus to the fixed support portion, using the transfer apparatus, and a distance from the receiving protrusion start position to the stop position is longer than a distance from the supplying protrusion start position to the stop position.

When a receiving operation is performed, the moving support portion moves toward the protruding position without supporting an article, and when a supplying operation is performed, the moving support portion moves toward the protruding position while supporting an article. That is, when a receiving operation is performed, the moving support portion can be located closer to the protruding position within a range where the moving support portion does not interfere with an interference object because the moving support portion does not support an article. Therefore, the receiving protrusion start position is set at a position from which the distance to the stop position is longer than from the supplying protrusion start position, and, in the case where a receiving operation is performed, the execution of the protrusion control can be started from a position that is farther from the stop position compared to the case where a supplying operation is performed. As a result, when a receiving operation is to be performed, it is possible to move the moving support portion as far as possible until the moving member stops, to reduce the time required to perform the receiving operation after the moving member has stopped at the stop position, and thus it is possible to improve the efficiency of article transportation.

It is also preferable that a second detection unit that detects the detection target member is provided on the moving support portion in a fixed state, and the second detection unit detects the detection target member as long as the moving member is located within the acceptable stop range and the moving support portion is located at the retracted position.

With this configuration, if the moving member is located within the acceptable stop range of the target stop position and the moving support portion is located at the retracted position, the second detection unit detects the detection target member. Therefore, if an abnormality occurs in the moving support portion regarding the attachment state thereof, for example, it is possible to detect the abnormality by checking the detection state of the second detection unit. That is, it is conceivable that, if the second detection unit is detecting the detection target member, the orientation or the like of the moving support portion at the retracted position can be determined as being normal, and if the second detection unit is not detecting the detection target member, the orientation or the like can be determined as being abnormal due to a certain abnormality in the moving support portion, such as an abnormality regarding the attachment state thereof relative to the moving member. Thus, it is possible to regularly check whether or not a receiving operation and a supplying operation can be appropriately performed.

It is also preferable that the moving member is provided with a rotation portion that rotates about an axis that extends in a top-bottom direction, and the transfer apparatus and the detection unit are provided on the rotation portion.

With this configuration, the transfer apparatus is provided on the rotation portion, and a plurality of directions can be set as the moving direction of the moving support portion that moves between the retracted position and the protruding position. Therefore, it is possible to provide fixed support portions not only in one direction, but also in a plurality of directions in plan view relative to the moving path, and improve the flexibility of the arrangement of fixed support portions. Furthermore, since the detection unit is also provided on the rotation portion, it is possible to perform a receiving operation and a supplying operation with fixed support portions that are provided in a plurality of directions by, for example, providing a detection target portion on each of the fixed support portions that are provided in a plurality of directions in plan view relative to the moving path.

What is claimed is:

1. An article transport facility comprising:
   a fixed support portion that is provided in a fixed state and supports an article;

a moving member that moves along a moving path that extends via a stop position that is set for the fixed support portion;

a transfer apparatus that is provided with a moving support portion configured to move integrally with the moving member along a widthwise direction that is orthogonal to a lengthwise direction of the moving path within a horizontal plane, and receives and supplies an article from and to the fixed support portion while the moving support portion moves to protrude and retract between a retracted position at which the moving support portion is housed within the moving path in terms of the widthwise direction and a protruding position at which the moving support portion protrudes outward from the moving path in the widthwise direction; and a control unit that controls movement of the moving member and a transfer operation that is performed by the transfer apparatus, the control unit configured to execute a stopping control to stop the moving member at the stop position, and a protrusion control to move the moving support portion of the transfer apparatus from the retracted position to the protruding position, wherein the article transport facility further comprises:

a detection target member that is provided at a position corresponding to the stop position, and has a length that is equal to a length of an acceptable stop range that is an acceptable range of the stop position, in the lengthwise direction; and a detection unit that is provided on the moving member, at a fixed position relative to the retracted position, and detects the detection target member with the moving member being located within the acceptable stop range, and the control unit is configured to start execution of the protrusion control upon the moving member reaching a protrusion start position as a result of the stopping control, the protrusion start position being set upstream of the stop position in a direction in which the moving member moves, and after the moving member has reached a protrusion monitoring start position that is set downstream of the protrusion start position in the direction in which the moving member moves toward the stop position, the control unit is configured to continue execution of the protrusion control as long as the detection unit is detecting the detection target member.

2. The article transport facility according to claim 1, wherein the control unit is configured to suspend the execution of the protrusion control upon the detection unit no longer detecting the detection target member, even after the moving member has stopped at the stop position as a result of the stopping control.

3. The article transport facility according to claim 2, wherein the control unit is configured to resume the execution of the protrusion control upon the detection unit detecting the detection target member again after the control unit has suspended the execution of the protrusion control.

4. The article transport facility according to claim 3, wherein:

the control unit is configured to selectively set a receiving protrusion start position or a supplying protrusion start position as the protrusion start position, the receiving protrusion start position is the protrusion start position that is set for a receiving operation that is performed to receive an article that is supported by the fixed support portion, using the moving support portion of the transfer apparatus, the supplying protrusion start position is the protrusion start position that is set for a supplying operation that is performed to supply an article that is supported by the moving support portion of the transfer apparatus to the fixed support portion, using the transfer apparatus, and a distance from the receiving protrusion start position to the stop position is longer than a distance from the supplying protrusion start position to the stop position.

5. The article transport facility according to claim 4, wherein a second detection unit that detects the detection target member is provided on the moving support portion in a fixed state, and wherein the second detection unit is configured to detect the detection target member as long as the moving member is located within the acceptable stop range and the moving support portion is located at the retracted position.

6. The article transport facility according to claim 5, wherein the moving member is provided with a rotation portion that rotates about an axis that extends in a top-bottom direction, and wherein the transfer apparatus and the detection unit are provided on the rotation portion.

7. The article transport facility according to claim 2, wherein:

the control unit is configured to selectively set a receiving protrusion start position or a supplying protrusion start position as the protrusion start position, the receiving protrusion start position is the protrusion start position that is set for a receiving operation that is performed to receive an article that is supported by the fixed support portion, using the moving support portion of the transfer apparatus, the supplying protrusion start position is the protrusion start position that is set for a supplying operation that is performed to supply an article that is supported by the moving support portion of the transfer apparatus to the fixed support portion, using the transfer apparatus, and a distance from the receiving protrusion start position to the stop position is longer than a distance from the supplying protrusion start position to the stop position.

8. The article transport facility according to claim 1, wherein:

the control unit is configured to selectively set a receiving protrusion start position or a supplying protrusion start position as the protrusion start position, the receiving protrusion start position is the protrusion start position that is set for a receiving operation that is performed to receive an article that is supported by the fixed support portion, using the moving support portion of the transfer apparatus, the supplying protrusion start position is the protrusion start position that is set for a supplying operation that is performed to supply an article that is supported by the moving support portion of the transfer apparatus to the fixed support portion, using the transfer apparatus, and a distance from the receiving protrusion start position to the stop position is longer than a distance from the supplying protrusion start position to the stop position.

9. The article transport facility according to claim 1, wherein a second detection unit that detects the detection target member is provided on the moving support portion in a fixed state, and wherein the second detection unit is configured to detect the detection target member as long as the moving member is located within the acceptable stop range and the moving support portion is located at the retracted position.

10. The article transport facility according to claim 1, wherein the moving member is provided with a rotation portion that rotates about an axis that extends in a top-bottom direction, and wherein the transfer apparatus and the detection unit are provided on the rotation portion.

* * * * *